United States Patent [19]
Kozono

[11] Patent Number: 5,619,070
[45] Date of Patent: Apr. 8, 1997

[54] SEMICONDUCTOR DEVICE WHICH RADIATES HEAT AND APPLIES SUBSTRATE POTENTIAL FROM REAR SURFACE OF SEMICONDUCTOR CHIP

[75] Inventor: Hiroyuki Kozono, Oomiya, Japan

[73] Assignee: Kabushiki Kaisha Toshiba, Kawasaki, Japan

[21] Appl. No.: 688,823

[22] Filed: Jul. 31, 1996

Related U.S. Application Data

[63] Continuation of Ser. No. 363,912, Dec. 27, 1994, abandoned.

[30]    Foreign Application Priority Data

Dec. 28, 1993   [JP]   Japan .................................. 5-337420

[51] Int. Cl.⁶ ............................. H01L 23/48; H01L 23/52
[52] U.S. Cl. ........................ 257/692; 257/698; 257/717; 257/738; 257/778
[58] Field of Search .................................. 257/778, 712, 257/692, 698, 713, 717, 719, 738

[56]    References Cited

U.S. PATENT DOCUMENTS

| 4,820,013 | 4/1989 | Fuse ........................................ 257/778 |
| 5,311,059 | 5/1994 | Banerji et al. ........................ 257/778 |
| 5,371,404 | 12/1994 | Juskey et al. ........................ 257/778 |
| 5,397,917 | 3/1995 | Ommen et al. ....................... 257/778 |
| 5,444,300 | 8/1995 | Sato et al. ............................. 257/778 |

OTHER PUBLICATIONS

Yasuo Nakatsuka et al., "Fine Pitch and High Lead Count Multilayer Ceramic QFP," IEEE 1993 Japan IEMT Symposium Proceedings, pp. 178–180, (Jun. 9–11, 1993).

"Multichip Module For 156MB/S Optical Interface", Tanaka et al., Japan IEMT Symposium, pp. 81–84 (1993).
"Fine Pitch and High Lead Count Multilayer Ceramic QFP", Nakatsuka et al., Japan IEMT Symposium, pp. 176–177 (1993).

*Primary Examiner*—Sara W. Crane
*Assistant Examiner*—David Ostrowski
*Attorney, Agent, or Firm*—Finnegan, Henderson, Farabow, Garrett & Dunner, L.L.P.

[57]    ABSTRACT

A semiconductor device includes a chip, a chip mounting plate, a heat radiating plate, first and second bumps, a conducting path forming member and a package. The chip has a semiconductor element in its main surface, and the rear surface thereof is mounted on the chip mounting plate with conductive adhesive. The chip mounting plate includes an insulating plate on which projecting portions are provided at corner portions, and a metal layer for covering the surface on which the chip is mounted. The projecting portions are formed such that the bottom surfaces thereof and the main surface of the chip are located on the same plane when the chip is mounted. The chip mounting plate is fixed to the heat radiating plate with adhesive. A first conducting path is provided on one surface of the conducting path forming member and a second conductive path is formed within the conducting path forming member. Bumps for connecting external terminals, which are electrically connected to the second conducting path are provided on the other surface of the conducting path forming member. The electrode of the chip is connected to the first conducting path via the first bumps, and the projecting portions are connected to the first conducting path via the second bump. The chip, the chip mounting plate, a portion of the heat radiating plate and a portion of the conducting path forming member are sealed in the package.

5 Claims, 3 Drawing Sheets

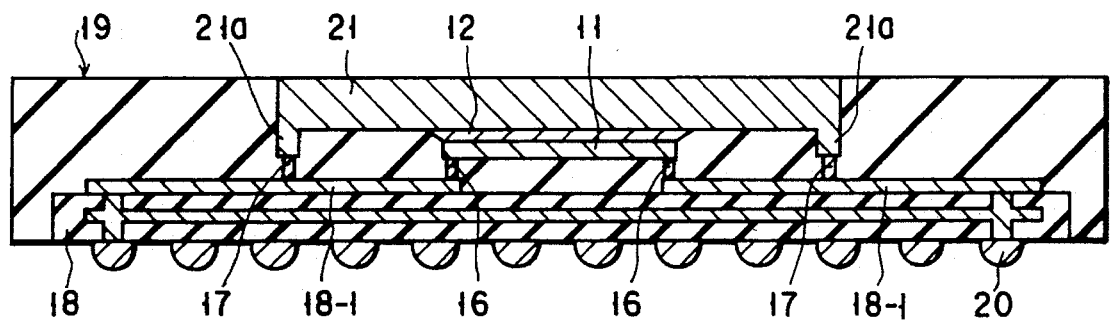
F I G. 3A
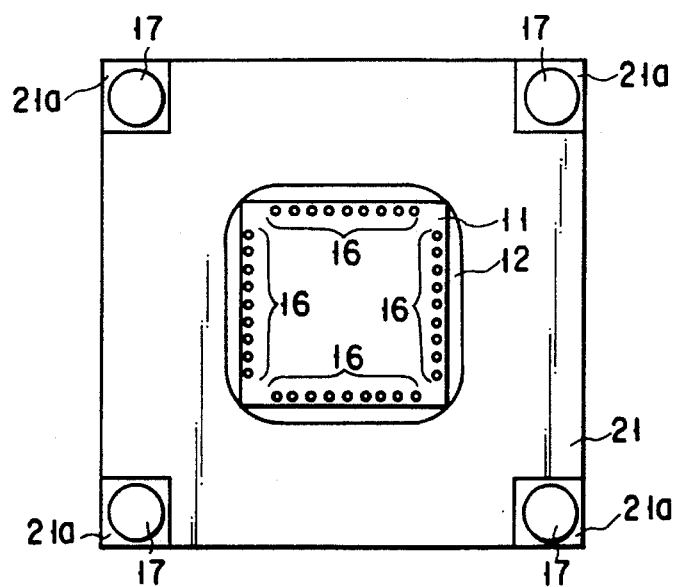
F I G. 3B

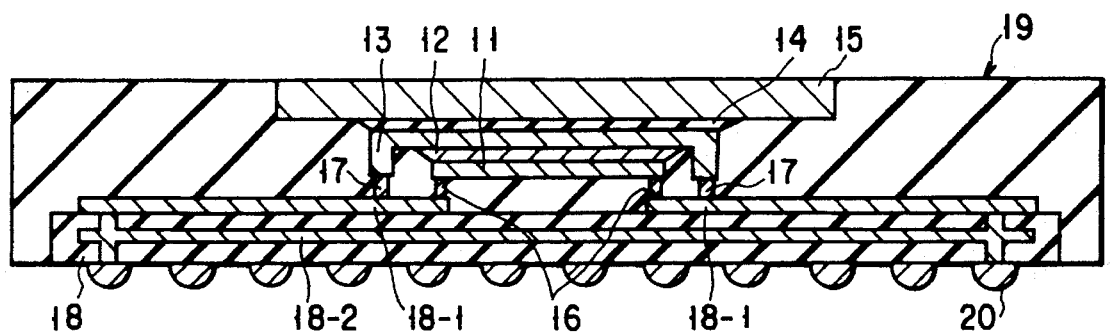
F I G. 2A
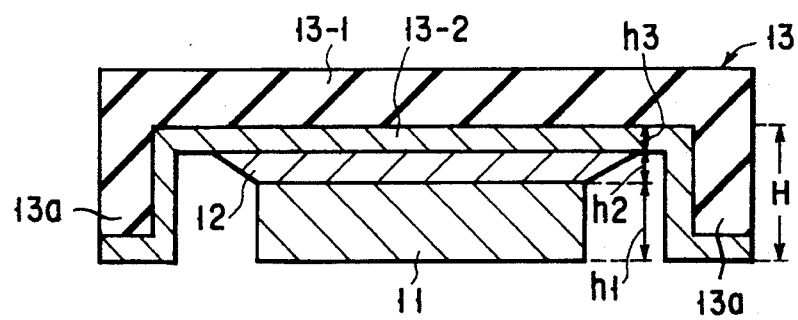
F I G. 2B
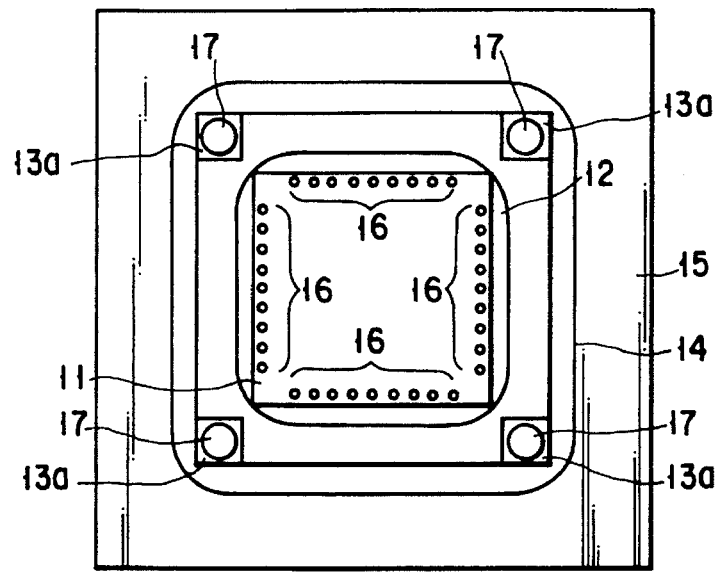
F I G. 2C

SEMICONDUCTOR DEVICE WHICH RADIATES HEAT AND APPLIES SUBSTRATE POTENTIAL FROM REAR SURFACE OF SEMICONDUCTOR CHIP

This application is a continuation of application Ser. No. 08/363,912, filed Dec. 27, 1994 now abandoned.

BACKGROUND OF THE INVENTION

1. Field of the Invention

The present invention relates to a semiconductor device which radiates heat and applies a substrate potential both from the rear surface of the semiconductor chip.

2. Description of the Related Art

In order to efficiently radiate heat generated from a semiconductor chip, the heat should be transmitted from the rear surface of the semiconductor chip, which is located opposite to the main surface on which a semiconductor element is provided. A semiconductor device having the structure in which heat is radiated from the rear surface of the semiconductor chip, is discussed in, for example, IEEE 1993 JAPAN IEMT SYMPOSIUM JUN. 9–11, 1993 KANAZAWA, JAPAN pp. 81–84. Tanaka et al., "MULTI-CHIP MODULE FOR 156 MB/S OPTICAL INTERFACE".

FIG. 1 is a diagram showing a conventional semiconductor device which radiates heat from the rear surface of the semiconductor chip. A semiconductor element is provided on the main surface (facing downward in FIG. 1) of a semiconductor chip 101, and a semiconductor chip mounting plate 103 which functions as a heat radiating plate is attached to the rear surface (facing upward in FIG. 1) via a buffer 102. The buffer 102 serves to reduce the stress applied to the semiconductor chip 101 and transmit the heat generated from the semiconductor chip 101 to the semiconductor chip mounting plate 103, and the buffer 102 is made of a material having a flexibility and a high heat conductivity. Bumps 104 are provided on the main surface of the semiconductor chip 101, which is attached to a conducting path forming member 105 via these bumps 104. On one surface of the conducting path forming member 105 which faces the semiconductor chip 101 and within the conducting path forming member 105 itself, conducting paths 107 are formed, and on the other surface, bumps 108 for connecting external terminals, which are electrically connected to these conducting paths 107, are provided. With this structure, a semiconductor element formed in the semiconductor chip 101 and the external-terminal-connection bumps 108 are electrically connected to each other. The semiconductor chip 101, the buffer 102, a portion of the semiconductor mounting plate 103, the bumps 104 and a portion of the conducting path forming member 105 are sealed by a package 106 made of a resin. The surface of the semiconductor chip mounting plate 103 and the surface of the conducting path forming member 105 on which the external-terminal-connection bump 108 are not covered by the package 106.

with the above-described structure, heat generated from the semiconductor chip 101 is propagated to the semiconductor chip mounting plate 103 via the buffer 102, and the heat is diffused from the exposed surface of the plate 103, which is not covered by the package 106, and radiating fin (not shown) provided on the exposed surface, thus achieving a highly efficient heat radiation.

In the case where a particular potential is applied to the semiconductor substrate, it is known that an electrode should be provided on the rear surface of a semiconductor chip. A semiconductor device in which the electrode of the rear surface is provided is discussed in, for example, IEEE 1993 JAPAN IEMT SYMPOSIUM JUN. 9–11, 1993 KANAZAWA, JAPAN pp. 176–177. Nakatsuka et al., "FINE PITCH AND HIGH LEAD COUNT MULTILAYER CERAMIC QFP. However, it is difficult to employ the above-described structure in which heat is radiated from the rear surface of a semiconductor chip and the structure in which an electrode is formed on the rear surface, at the same time. Thus, in the semiconductor device shown in FIG. 1, an electrode cannot be formed on the rear surface of the semiconductor chip 101, and therefore an electrode to be formed on the rear surface of the semiconductor chip 101, i.e. an electrode used for applying a substrate electrode, is formed in the main surface of the semiconductor chip 101. With such a structure, the size of the chip is increased, and this structure is disadvantageous to the production process of semiconductor devices.

SUMMARY OF THE INVENTION

The object of the present invention is to provide a semiconductor device capable of applying a substrate potential from the rear surface of the semiconductor chip while maintaining a good heat radiation property.

The object of the present invention is achieved by a semiconductor device comprising: a semiconductor chip having a main surface region in which a semiconductor element is provided, and a rear surface on which a rear surface electrode for applying a substrate potential is applied, is provided; a semiconductor chip mounting portion having a first surface to which the rear surface of the semiconductor chip is attached, at least the first surface being made of a metal, and projecting portions being formed in a periphery portion of the first surface; a conducting path forming member having a conducting path electrically connected to the semiconductor chip and the projecting portions of the semiconductor chip mounting member; and a package for sealing the semiconductor chip.

With the above-described structure, the rear surface of the semiconductor chip is attached to the metal portion of the semiconductor chip mounting portion, and the rear electrode is connected to the conducting path forming member via projections of the semiconductor chip mounting portion. Further, heat from the semiconductor chip is diffused from the heat radiating plate via the semiconductor chip mounting portion. Therefore, the rear surface electrode can be formed on the rear surface of the semiconductor chip, and the heat can be diffused from the rear surface.

Consequently, the size of the chip can be reduced and the production process can be simplified.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2A is a cross section showing a semiconductor device according to the first embodiment of the present invention;

FIG. 2B is a cross section showing an enlarged view of the semiconductor chip mounting plate shown in FIG 2A.

FIG. 2C is a partial plan view of the semiconductor device shown in FIG. 2A, when viewed from the main surface side of the semiconductor chip;

FIG. 3A is a cross section showing a semiconductor device according to the second embodiment of the present invention;

FIG. 3B is a partial plan view of the semiconductor device shown in FIG. 3A, when viewed from the main surface side of the semiconductor chip.

DETAILED DESCRIPTION OF THE PREFERRED EMBODIMENTS

Figure 1:
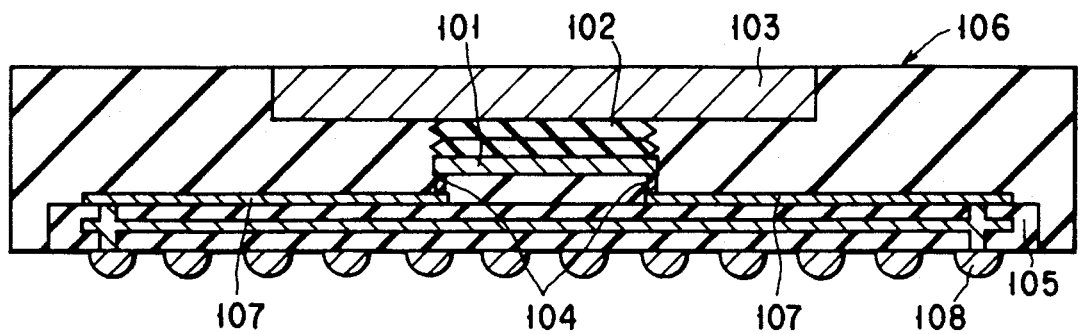
FIG. 1 is a cross section showing a conventional semiconductor device having the structure in which heat is radiated from the rear surface of the semiconductor chip.

FIGS. 2A to 2C show the semiconductor device according to the first embodiment of the present invention. FIG. 2A is a cross section of the entire semiconductor device, FIG. 2B is a cross section showing an enlarged view of the semiconductor chip mounting plate shown in FIG. 2A, FIG. 2C is a partial plan view of the semiconductor device shown in FIG. 2A, when viewed from the main surface side of the semiconductor chip. FIG. 2C is a cross section in the state where, after a semiconductor chip is mounted on a semiconductor chip mounting plate, and a heat radiating plate is attached to the semiconductor chip mounting plate, in the middle of the production of the semiconductor device.

As shown in FIG. 2A, the rear surface (the surface opposite to the main surface on which a semiconductor element is formed) of a semiconductor chip 11 is attached to a semiconductor chip mounting plate 13 by a conductive adhesive 12. Projections 13a as shown in FIG. 2B are provided in the periphery portion of the attachment section of the semiconductor chip 11 with the semiconductor chip mounting plate 13, that is, for example, the corner portions of the mounting plate 13. The semiconductor chip mounting plate 13 is fixed to a heat radiating plate 15 made of Cu or the like, by means of the adhesive 14. Bumps 16 are provided on a pad electrode (not shown) on the main surface of the semiconductor chip 11. Bumps 17 are provided respectively on the projections 13a of the semiconductor chip mounting plate 13. In the conductive path forming member 18, a conducting path 18-1 is provided on the surface which faces the semiconductor chip 11, and a conducting path 18-2 is formed within, and the external-terminal-connection bumps 20 connected to the conducting paths 18-1 and 18-2 are formed on the rear surface. Each of the bumps 16 and 17 is connected to the conducting path 18-1. The semiconductor element provided within the semiconductor chip 11 and the external-terminal-connection bump 20 are electrically connected to each other. A resin-made package 19 seals the semiconductor chip 11, the semiconductor chip mounting plate 13, a portion of the heat radiating plate 15, the bumps 16 and 17, and a portion of the conducting path forming member 20. The surface of the heat radiating plate 15 and the surface of the conducting path forming member 18 on which the external-terminal-connection bumps 20 are formed, are not covered by the package 19.

Next, the structure of the semiconductor chip mounting plate 13 will be described in detail with reference to FIG. 2B. The semiconductor chip mounting plate 13 includes an insulating plate 13-1 and a metal layer 13-2 which covers the surface of the insulating plate 13-1 which is attached to the semiconductor chip 11. The projections 13a are provided in the periphery portion of the connecting section of the semiconductor chip 11 with the semiconductor chip mounting plate 13. The insulating plate 13-1 is made of a ceramic material having a high heat conductivity and a high insulating property. The projections 13a are formed such that the bottom surfaces of the projections 13a and the surface of the semiconductor chip 11 are substantially in the same plain when the semiconductor chip 11 is mounted on the semiconductor chip mounting plate 13. In other words, the height H of the projections 13a is equal to the sum of a thickness h1 of the semiconductor chip 11, a thickness h2 of the adhesive 14 and a thickness h3 of the metal layer 13-2.

As shown in FIG. 2C, the semiconductor chip 11 is mounted in the center portion of the semiconductor chip mounting plate 13, and the semiconductor chip mounting plate 13 is fixed to the heat radiating plate 15 with the adhesive 14. The bumps 17 are formed on the projections 13a of the semiconductor chip mounting plate 13, and the bumps 16 are formed on the pad electrode of the semiconductor chip 11. The bumps 16 and 17 all have substantially the same thickness, and the bottom surfaces of the projections 13a and the surface of the semiconductor chip 11 are located on substantially the same plane. Therefore, the surfaces of the bumps 16 and 17 are located in substantially the same plane.

With the above-described structure, the heat generated from the semiconductor chip 11 is propagated to the heat radiating plate 15 from the rear surface of the semiconductor chip 11 via the semiconductor chip mounting plate 13, and the heat is diffused from the exposed surface of the heat radiating plate 15. The insulating plate 13-1 of the semiconductor chip mounting plate 13 is made of ceramics, and the heat radiating plate 15 is made of Cu or the like; therefore a high heat radiation property can be achieved. The metal layer 13-2 is electrically connected to the rear surface electrode of the semiconductor chip 11 via the conductive adhesive 12, and is also electrically connected to the external-terminal-connecting bumps 20 via the bumps 17, the conducting paths 18-1 and 18-2. With this structure, by applying a substrate potential to the external-terminal-connection bumps 20, the substrate potential is applied to the rear surface electrode of the projections 13a and 13a. Since the bottom surfaces of the projections 13a and the surface of the semiconductor chip 11 are located in substantially the same plane, and the bumps 16 and 17 have the same thickness, the projections 13a serve to reduce the stress applied to the semiconductor chip 11 as the buffer 102 shown in FIG. 1, when the bumps 16 and 17 are connected to the conducting path 18-1 by pressing the heat radiating plate 15 against the conducting path forming member 18. Consequently, the semiconductor chip 11, the semiconductor mounting plate 13, and the conducting path forming member 18 can be easily connected with each other without crushing the semiconductor chip 11.

As described above, according to this embodiment, a rear surface electrode is formed on the rear surface of a semiconductor chip, and therefore a substrate potential can be applied while maintaining a high heat radiating property. Thus, the size of the chip can be reduced. Further, electrodes including a rear surface electrode, which are formed on the semiconductor chip 11, are connected to the conducting path forming member 18 via the bumps 16 and 17, and structural members can be mounted at a high density.

The first embodiment was described in connection with the case where the heat radiation is carried out from the portion of the heat radiating plate 15 which is not covered by the package 19; however it is also possible that a heat radiating fin can be set on the heat radiating plate 19. In this case, the heat radiating fin becomes electrically neutral, and therefore it is expected that operational characteristics of the integrated circuit formed in the semiconductor chip 11 are improved in a high frequency range.

Next, a semiconductor device according to the second embodiment of the present invention will now be described with reference to FIGS. 3A and 3B. The semiconductor device shown in FIGS. 3A and 3B has basically the same structure as that shown in FIGS. 2A to 2C except that the semiconductor chip mounting plate and the heat radiating plate are integrated into one unit. More specifically, a semiconductor chip mounting portion 21 in this embodiment corresponds to a set of the semiconductor chip mounting plate 13 and the heat radiating plate 15 shown in FIG. 2A. The semiconductor chip mounting portion 21 is made of a metal having a high heat radiation property, such as Cuw or Cu, and projections 21a are provided in the periphery thereof. A semiconductor chip 11 is mounted on the semiconductor chip mounting portion 21 with a conductive adhesive 12. As shown in FIG. 3B, bumps 17 are provided on the projections 21a, and bumps 16 are provided on a pad electrode of the semiconductor chip 11.

Figure 4:
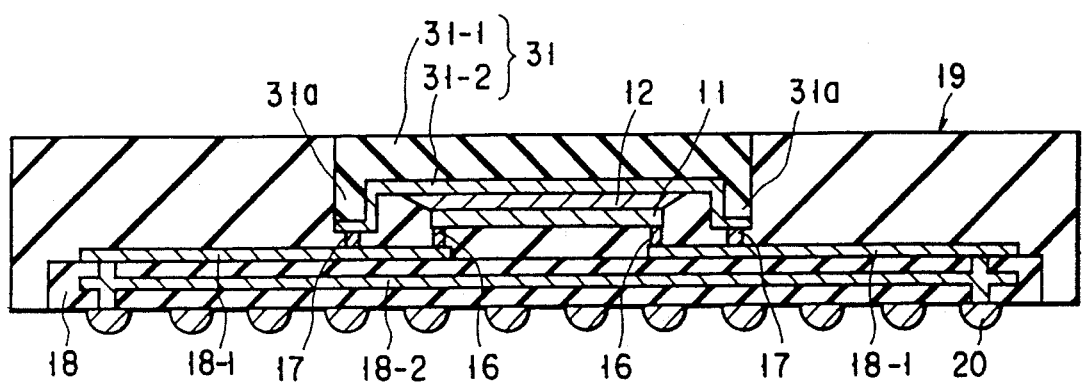
FIG. 4 is a cross section showing a semiconductor device according to the third embodiment of the present invention.

Next, a semiconductor device according to the third embodiment of the present invention will now be described with reference to FIG. 4. In similar to the semiconductor chip mounting plate 13 of the first embodiment, a semiconductor chip mounting portion 31 of this embodiment includes a ceramic-based insulating plate 31-1 and a metal layer 31-2 which covers the surface on which a semiconductor chip 11 is attached, and projections 31a are provided on the periphery portion thereof. In the semiconductor having such a structure, heat generated from the semiconductor chip 11 is diffused from the semiconductor chip mounting portion 31. In the meantime, the rear surface electrode of the semiconductor chip 11 are electrically connected to external-terminal-connection bumps 20 via the metal layer 31-2, bumps 17 and conducting paths 18-1 and 18-2.

With the structure based on the second or third embodiment, a substrate potential can be applied to the rear surface of the semiconductor chip 11 while maintaining a high heat radiating property, as in the case of the first embodiment.

Lastly, the first to third embodiments were explained in connection with the case where projections are provided at four corners of a semiconductor chip mounting plate; however the projections may be situated at arbitrary positions as long as they are close to the mounting section of the semiconductor chip 11.

What is claimed is:

1. A semiconductor device comprising:

a semiconductor chip including a main surface region having a semiconductor element and a rear surface to which a substrate potential is applied;

a semiconductor chip mounting portion having a first layer to which said semiconductor chip is attached at said rear surface, said first layer being made of a metal and comprising a first main part and a first edge part protruding from the first main part, and a second layer on said first layer, said second layer being an insulator and comprising a second main part and a second edge part protruding from the second main part, the first and second edge parts forming a projection which includes a surface located in substantially the same plane as the main surface region of said semiconductor chip;

a conducting path forming member having a conducting path electrically connected to said semiconductor chip and said edge part of said first layer of said semiconductor chip mounting portion; and a package for sealing said semiconductor chip;

wherein an outside potential is applied to the rear surface of said semiconductor chip through said first layer of said semiconductor chip mounting portion and said conducting path forming member.

2. A semiconductor device according to claim 1, further comprising a heat radiating plate attached to said second layer of said semiconductor chip mounting portion, a portion of said heat radiating plate within said package being exposed to an exterior portion of the package.

3. A semiconductor device according to claim 1, wherein said first layer of said semiconductor chip mounting portion is made of a metal plate and said second surface layer of said semiconductor chip mounting portion within said package is exposed to an exterior portion of the package.

4. A semiconductor device according to claim 1, further comprising first bumps provided on said first edge part and second bumps provided on a pad electrode of said semiconductor chip, wherein said first and second bumps are connected to the conducting path provided on a surface of said conductive path forming member.

5. A semiconductor device according to claim 1, further comprising solder plate layers provided on said first edge part, and bumps provided on a pad electrode of said semiconductor chip, wherein said solder plate layer and said bumps are connected to the conducting path provided on a surface of said conductive path forming member.

* * * * *